(12) United States Patent
Suwada et al.

(10) Patent No.: US 9,653,380 B2
(45) Date of Patent: May 16, 2017

(54) METHOD FOR MANUFACTURING COMPONENT BUILT-IN SUBSTRATE

(71) Applicant: FUJITSU LIMITED, Kawasaki-shi, Kanigawa (JP)

(72) Inventors: Makoto Suwada, Kawasaki (JP); Mitsutaka Yamada, Atsugi (JP); Masumi Suzuki, Kawasaki (JP); Michimasa Aoki, Kawasaki (JP); Keizou Takemura, Kawasaki (JP); Shinichirou Okamoto, Yokohama (JP); Kenji Katsumata, Odawara (JP); Jie Wei, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/138,329

(22) Filed: Apr. 26, 2016

(65) Prior Publication Data

US 2016/0351471 A1   Dec. 1, 2016

(30) Foreign Application Priority Data

May 26, 2015   (JP) .................. 2015-106297

(51) Int. Cl.
| | |
|---|---|
| *H01L 23/34* | (2006.01) |
| *H01L 23/473* | (2006.01) |
| *H01L 23/367* | (2006.01) |
| *H01L 23/427* | (2006.01) |
| *H01L 23/00* | (2006.01) |
| *H01L 25/065* | (2006.01) |

(52) U.S. Cl.
CPC ........ *H01L 23/473* (2013.01); *H01L 23/3675* (2013.01); *H01L 23/427* (2013.01); *H01L 24/13* (2013.01); *H01L 24/16* (2013.01); *H01L 24/17* (2013.01); *H01L 25/0657* (2013.01); *H01L 2224/131* (2013.01); *H01L 2224/16145* (2013.01); *H01L 2224/16227* (2013.01); *H01L 2224/17181* (2013.01); *H01L 2225/06513* (2013.01); *H01L 2225/06517* (2013.01); *H01L 2225/06565* (2013.01); *H01L 2225/06589* (2013.01); *H01L 2924/15312* (2013.01)

(58) Field of Classification Search
CPC ..... H01L 23/4006; H01L 23/28; H01L 23/40; H01L 23/051; H01L 23/4334; H01L 23/3107; H01L 23/473; H01L 23/3675; H01L 23/04
See application file for complete search history.

(56) References Cited

U.S. PATENT DOCUMENTS 4,884,169 A * 11/1989 Cutchaw ............ H01L 23/427
                                                      165/104.33

FOREIGN PATENT DOCUMENTS

| JP | 61-054654 | 3/1986 |
|---|---|---|
| JP | 03-050897 | 3/1991 |
| JP | 2008-227150 | 9/2008 |

* cited by examiner

*Primary Examiner* — (Vikki) Hoa B Trinh
(74) *Attorney, Agent, or Firm* — Fujitsu Patent Center

(57) ABSTRACT

A substrate is disclosed, which can remove heat from a stacked body of semiconductor elements through a phase change of a coolant. The substrate of the application includes: a stacked body of semiconductor elements; a first channel forming a path, receiving circulation of a first coolant, in a surface of the stacked body; and a second channel forming a path, receiving circulation of a second coolant having a boiling point higher than the boiling point of the first coolant, in an inter-layer portion of the stacked body.

2 Claims, 2 Drawing Sheets

METHOD FOR MANUFACTURING COMPONENT BUILT-IN SUBSTRATE

CROSS-REFERENCE TO RELATED APPLICATION

This application is based upon and claims the benefit of priority of the prior Japanese Patent Application No. 2015-106297, filed on May 26, 2015, the entire contents of which are incorporated herein by reference.

FIELD

The present application pertains to a substrate including a cooling mechanism.

BACKGROUND

Over the recent years, electronic appliances including a variety of cooling mechanisms have been developed (refer to, e.g., Patent documents 1-3).

Patent Document

[Patent document 1] Japanese Patent Application Laid-Open Publication No. 2008-227150
[Patent document 2] Japanese Patent Application Laid-Open Publication No. H03-50897
[Patent document 3] Japanese Patent Application Laid-Open Publication No. S61-54654

SUMMARY

The present application discloses a substrate to be described below. To be specific, the substrate disclosed by the present application includes: a stacked body of semiconductor elements; a first channel forming a path, receiving circulation of a first coolant, in a surface of the stacked body; and a second channel forming a path, receiving circulation of a second coolant having a boiling point higher than the boiling point of the first coolant, in an inter-layer portion of the stacked body.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Embodiments will hereinafter be described. The embodiments to be illustrated below are just exemplifications but do not limit the technical scope of the present disclosure to the following modes.

Figure 1:
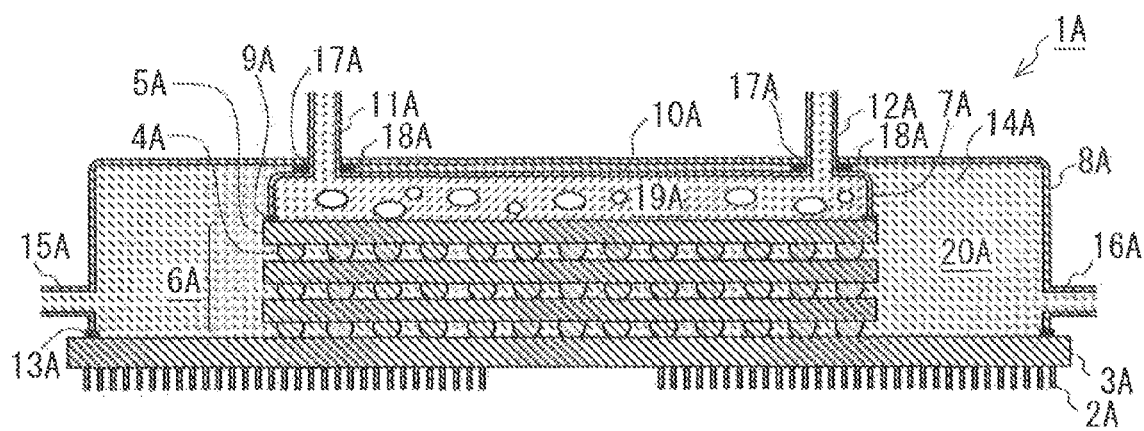
FIG. 1 is a diagram of a structure of a semiconductor package according to a first embodiment.

FIG. 1 is a diagram illustrating a structure of a semiconductor package according to a first embodiment. A semiconductor package 1A according to the first embodiment includes: a package substrate 3A having a lower surface on which to array a multiplicity of lead pins 2A lengthwise and crosswise; and a stacked body 6A configured by stacking there pieces of semiconductor elements 5A via solder balls 4A at a central portion of an upper surface of the package substrate 3A. Gaps existing along peripheries of the solder balls 4A between the semiconductor elements 5A, enable a coolant to flow from a side of stacked surfaces of the stacked body 6A. Note that the stacked surfaces of the stacked body 6A are surfaces extending in a stacking direction of the stacked body 6A and are, e.g., the surfaces at which to expose edges of the semiconductor elements 5A configuring the stacked body 6A.

The semiconductor package 1A further includes a first enclosure 7A covering the upper surface of the stacked body 6A, and a second enclosure 8A housing the stacked body 6A and the first enclosure 7A.

The first enclosure 7A is a rectangular box with its lower side being opened. The first enclosure 7A has a first channel 10A formed inside to cause the coolant to flow along the upper surface of the stacked body 6A by being tightly fitted to the upper surface of the stacked body 6A via a first hermetic seal 9A provided along a lower edge of the rectangular shape configuring the lower open portion. Note that an upper portion of the first enclosure 7A is provided with a first coolant inflow port 11A and a first coolant outflow port 12A, which communicate with an interior of the first enclosure 7A.

The second enclosure 8A is a rectangular box with its lower side being opened. The second enclosure 8A has a second channel 14A formed inside to cause the coolant to flow through inter-layer portions of the stacked body 6A by being tightly fitted to the upper surface of the package substrate 3A via a second hermetic seal 13A provided along a lower edge of the rectangular shape configuring the lower open portion. Note that side portions of the second enclosure 8A are provided with a second coolant inflow port 15A and a second coolant outflow port 16A, which communicate with an interior of the second enclosure 8A. An upper portion of the second enclosure 8A is formed with holes 17A for permitting passages of the first coolant flow inlet 11A and the first coolant outflow port 12A each provided in the first enclosure 7A. A third hermetic seal 18A for preventing a leakage of the coolant within the second enclosure 8A is provided along an edge of the hole 17A.

When the semiconductor package 1A is assembled to a product and when a coolant pipe is connected to the first coolant flow inlet 11A, the first coolant outflow port 12A, the second coolant inflow port 15A and the second coolant outflow port 16A, the interior of the first enclosure 7A is filled with a first coolant 19A, and the interior of the second enclosure 8A is filled with a second coolant 20A. The first coolant 19A is a coolant that is boiled by heat generated by the semiconductor elements 5A in operation and is properly selected corresponding to various conditions instanced by a heating value, an upper limit temperature and other equivalent values of the semiconductor elements 5A. The second coolant 20A is a coolant that is higher in boiling point than the first coolant 19A but is not boiled by the heat generated by the semiconductor elements 5A in normal operation. An allowable maximum temperature of the semiconductor elements 5A is, e.g., 85° C., in which case it is preferable to use a coolant with the boiling point equal to or higher than 85° C. as the second coolant 20A.

A quantity of heat removable by the coolant is larger when removing the heat due to a latent heat variation than when removing the heat due to a sensible heat variation. Such being the case, in order to efficiently cool the semiconductor elements 5A, it is considered to perform cooling based on a phase change by using a low boiling point coolant boiled by the heat generated by the semiconductor elements 5A for cooling the semiconductor elements 5A. However, when air bubbles are produced in spaces as narrow as the gaps between the semiconductor elements 5A of the stacked body 6A, the air bubbles hinder the coolant flow to reduce a cooling effect conversely. The air bubbles are also hard to separate from the surfaces of the semiconductor elements 5A in the narrow spaces like the gaps between the semiconductor elements 5A of the stacked body 6A, and consequently such a possibility arises that the air bubbles remaining on the surfaces of the semiconductor elements 5A are covered to form layers over the surface of the semiconductor elements 5A.

However, the first coolant 19A boiling on the upper surface of the stacked body 6A changes to a gas phase from a liquid phase, and the semiconductor package 1A according to the first embodiment is thereby enabled to remove a large amount of heat generated by the semiconductor elements 5A. The air bubbles do not therefore reduce the cooling effect due to the hindrance of the coolant flow through between the semiconductor elements 5A of the stacked body 6A, and the heat can be properly removed based on the sensible heat variation of the second coolant 20A.

Figure 2:
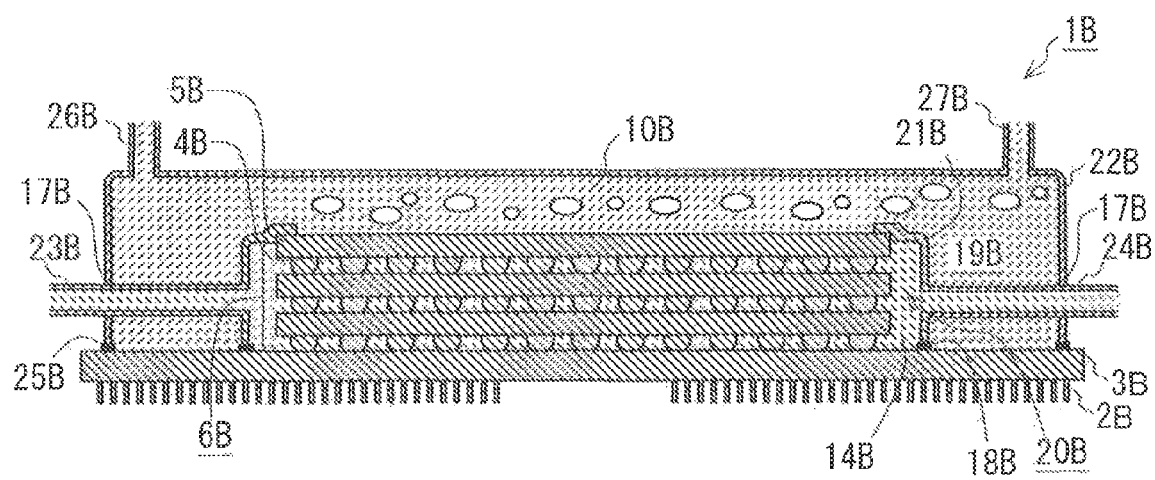
FIG. 2 is a diagram of a structure of the semiconductor package according to a second embodiment.

FIG. 2 is a diagram of a structure of the semiconductor package according to a second embodiment. A semiconductor package 1B according to the second embodiment is different from the semiconductor package 1A according to the first embodiment in terms of shapes of the enclosures formed with the coolant channels. To be specific, the semiconductor package 1B according to the second embodiment, similarly to the semiconductor package 1A according to the first embodiment, includes: a package substrate 3B having a lower surface on which to array a multiplicity of lead pins 2B lengthwise and crosswise; and a stacked body 6B configured by stacking there pieces of semiconductor elements 5B via solder balls 4B at a central portion of an upper surface of the package substrate 3B. The semiconductor package 1B further includes: a third enclosure 21B covering stacked surface of the stacked body 6B; and a fourth enclosure 22B housing the stacked body 6B and the third enclosure 21B.

The third enclosure 21B is a rectangular box that is entirely opened on its lower side and opened along a shape of the semiconductor element 5B on its upper side. The third enclosure 21B has a second channel 14B formed within the third enclosure 21B to cause the coolant to flow alongside surfaces of the stacked body 6B by being tightly fitted to the upper surface of the stacked body 6B via a third hermetic seal 18B provided along a lower edge of the rectangular shape configuring the lower open portion. Note that a side portion of the third enclosure 21B is provided with a third coolant inflow port 23B and a third coolant outflow port 24B, which communicate with an interior of the third enclosure 21B.

The fourth enclosure 22B is a rectangular box with its lower side being opened. The fourth enclosure 22B has a first channel 10B formed within the fourth enclosure 22B to cause the coolant to flow along the upper surface of the stacked body 6B by being tightly fitted to the upper surface of the package substrate 3B via a fourth hermetic seal 25B provided along a lower edge of the rectangular shape configuring the lower open portion. Note that an upper portion of the fourth enclosure 22B is provided with a fourth coolant inflow port 26B and a fourth coolant outflow port 27B, which communicate with an interior of the fourth enclosure 22B. Side portions of the fourth enclosure 22B are formed with holes 17B for permitting passages of the third coolant inflow port 23B and the third coolant outflow port 24B each provided in the third enclosure 21B.

When the semiconductor package 1B is assembled to the product and when the coolant pipe is connected to the third coolant inflow port 23B, the third coolant outflow port 24B, the fourth coolant inflow port 26B and the fourth coolant outflow port 27B, the interior of the third enclosure 21B is filled with a second coolant 20B, and the interior of the fourth enclosure 22B is filled with a first coolant 19B. The first coolant 19B is a coolant that is boiled by the heat generated by the semiconductor elements 5B in operation and is properly selected corresponding to the various conditions instanced by the exothermic quantity, the upper limit temperature and other equivalent values of the semiconductor elements 5B. The second coolant 20A is a coolant that is higher in boiling point than the first coolant 19A but is not boiled by the heat generated by the semiconductor elements 5A in normal operation. An allowable maximum temperature of the semiconductor elements 5A is, e.g., 85° C., in which case it is preferable to use a coolant with the boiling point equal to or higher than 85° C. as the second coolant 20A. The second coolant 20B is a coolant that is higher in boiling point than the first coolant 19B and is not boiled by the heat generated by the semiconductor elements 5B in normal operation.

Similarly to the semiconductor package 1A according to the first embodiment, the first coolant 19B boiling on the upper surface of the stacked body 6B changes to the gas phase from the liquid phase, and the semiconductor package 1B according to the second embodiment is thereby enabled to remove the large amount of heat generated by the semiconductor elements 5B. The air bubbles do not therefore reduce the cooling effect due to the hindrance of the coolant flow through between the semiconductor elements 5B of the stacked body 6B, and the heat can be properly removed based on the sensible heat variation of the second coolant 20B.

Figure 3:
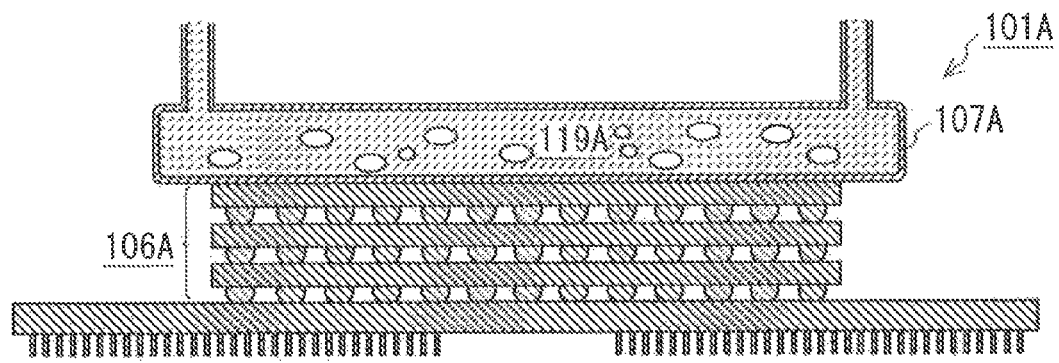
FIG. 3 is a diagram of a structure of the semiconductor package according to a first comparative example.

FIG. 3 is a diagram of a structure of the semiconductor package according to a first comparative example. For example, as in the case of a semiconductor package 101A according to the first comparative example, the package is provided with an enclosure 107A in which to circulate a coolant 119A boiling on an upper surface of a stacked body 106A, whereby the large amount of heat on the upper surface of the stacked body 106A is removed through the phase change to the gas phase from the liquid phase of the coolant 119A. The semiconductor package 101A according to the first comparative example has, however, a possibility of being overheated because an interior of the stacked body 106A is not cooled.

Figure 4:
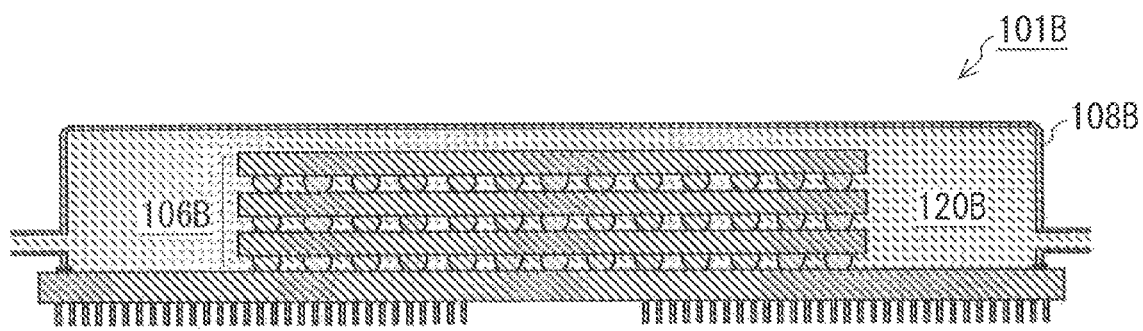
FIG. 4 is a diagram of a structure of the semiconductor package according to a second comparative example.

FIG. 4 is a diagram of a structure of the semiconductor package according to a second comparative example. For example, as in the case of a semiconductor package 101B according to the second comparative example, the package is provided with an enclosure 108B in which to circulate a coolant 120B receiving immersion of a stacked body 106B, whereby the stacked body 106B is cooled throughout. However, when trying to remove the large amount of heat through the phase change to the gas phase from the liquid phase, the air bubbles generated inside the stacked body 106B hinder the flow of the coolant 120B, resulting in the possibility that the interior of the stacked body 106B is overheated.

On the other hand, both of the first embodiment and the second embodiments enable the large amount of heat to be removed through the phase change to the gas phase from the liquid phase, and the effective cooling to be attained, which is compatible with the cooling of the interior of the semiconductor body.

Note that the first and second embodiments described above have exemplified each individual semiconductor package by way of one example of the substrate disclosed by the present application. The substrate disclosed by the present application is not, however, limited to the semiconductor package. The substrate disclosed by the present application may be, e.g., an interposer and may also be any one of a variety of other electronic components.

The first and second embodiments described above have exemplified the package substrates each configured by stacking the three semiconductor elements, and the number of semiconductor elements is not, however, limited to "3". The substrate disclosed by the present application may be a substrate including a stacked body configured by stacking two semiconductor elements, and may also be a substrate including a stacked body configured by four or more semiconductor elements.

Although the first and second embodiments described above did not discuss how the coolant flows, each coolant may be forcibly circulated by a driving apparatus and other equivalent apparatuses instanced by a pump, and may also be circulated naturally by a convection based on a temperature difference.

With higher performance of electronic appliances, an exothermic quantity of semiconductor elements continues rising. By the way, a quantity of heat removable by a coolant used for cooling the semiconductor elements is larger when removing the heat due to a latent heat variation than when removing the heat due to a sensible heat variation. Such being the case, in order to efficiently cool the semiconductor elements with the exothermic quantity continuing to rise, it is considered to perform cooling based on a phase change by using a low boiling point coolant boiled by the heat generated by the semiconductor elements for cooling the semiconductor elements. However, when trying to cool a stacked body of the semiconductor elements, which have been increasingly developed in recent years, by the low boiling point coolant, air bubbles produced in between layers hinder a flow of the coolant, resulting in a possibility that the semiconductor elements of the respective layers are not cooled.

Under such circumstances, the present application aims at providing a substrate that can remove heat from a stacked body of semiconductor elements through a phase change of a coolant.

The foregoing substrate, when adopted, can remove the heat from the stacked body configured by the semiconductor elements through the phase change of the coolant.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A substrate comprising:
   a stacked body formed by layering up a plurality of semiconductor elements;
   a first channel forming a path, receiving circulation of a first coolant, on a surface of the stacked body;
   a second channel forming a path, receiving circulation of a second coolant having a boiling point higher than the boiling point of the first coolant, in an inter-layer portion of the stacked body;
   a first enclosure covering the surface of the stacked body; and
   a second enclosure housing the stacked body and the first enclosure,
   the first channel being a channel passing through within the first enclosure, and
   the second channel being a channel passing through within the second enclosure.

2. A substrate comprising:
   a stacked body formed by layering up a plurality of semiconductor elements;
   a first channel forming a path, receiving circulation of a first coolant, on a surface of the stacked body;
   a second channel forming a path, receiving circulation of a second coolant having a boiling point higher than the boiling point of the first coolant, in an inter-layer portion of the stacked body;
   a first enclosure covering stacked surfaces of the stacked body; and
   a second enclosure housing the stacked body and the first enclosure,
   the first channel being a channel passing through within the second enclosure, and
   the second channel being a channel passing through within the first enclosure.

* * * * *